（12） United States Patent
Chan et al.

(10) Patent No.: US 8,375,172 B2
(45) Date of Patent: Feb. 12, 2013

(54) PREVENTING FAST READ BEFORE WRITE IN STATIC RANDOM ACCESS MEMORY ARRAYS

(75) Inventors: Eddie K. Chan, Austin, TX (US); Michael J. Lee, Austin, TX (US); Ricardo H. Nigaglioni, Austin, TX (US); Bao G. Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 483 days.

(21) Appl. No.: 12/761,618

(22) Filed: Apr. 16, 2010

(65) Prior Publication Data
US 2011/0258395 A1    Oct. 20, 2011

(51) Int. Cl.
G06F 12/00 (2006.01)
G06F 13/00 (2006.01)
G06F 13/28 (2006.01)
G11C 11/00 (2006.01)
G11C 7/00 (2006.01)

(52) U.S. Cl. ......... 711/142; 711/167; 365/154; 365/195
(58) Field of Classification Search .................. 711/142, 711/167; 365/154, 195
See application file for complete search history.

(56) References Cited

U.S. PATENT DOCUMENTS

| 5,357,479 | A | 10/1994 | Matsui |
| 5,717,653 | A | 2/1998 | Suzuki |
| 6,061,292 | A | 5/2000 | Su et al. |
| 7,113,433 | B2 | 9/2006 | Chan et al. |
| 7,193,904 | B2* | 3/2007 | Joshi ......................... 365/189.08 |
| 7,272,030 | B2 | 9/2007 | Chan et al. |
| 7,274,590 | B2 | 9/2007 | Joshi |
| 2006/0098499 | A1* | 5/2006 | Joshi ......................... 365/189.08 |
| 2006/0176729 | A1* | 8/2006 | Chan et al. ..................... 365/154 |
| 2006/0176753 | A1* | 8/2006 | Chan et al. ............... 365/230.03 |
| 2008/0031065 | A1 | 2/2008 | Kajitani et al. |
| 2008/0247246 | A1 | 10/2008 | Joshi |
| 2012/0195107 | A1* | 8/2012 | Christensen et al. ......... 365/154 |

* cited by examiner

Primary Examiner — Michael Alsip
(74) Attorney, Agent, or Firm — Francis Lammes; Stephen J. Walder, Jr.; Diana R. Gerhardt (57) ABSTRACT

A mechanism is provided for enabling a proper write through during a write-through operation. Responsive to determining the memory access as a write-through operation, first circuitry determines whether a data input signal is in a first state or a second state. Responsive to the data input signal being in the second state, the first circuitry outputs a global write line signal in the first state. Responsive to the global write line signal being in the first state, second circuitry outputs a column select signal in the second state. Responsive to the column select signal being in the second state, third circuitry keeps a downstream read path of the cache access memory at the first state such that data output by the cache memory array is in the first state.

21 Claims, 9 Drawing Sheets

MEMORY CELL 300

MEMORY CELL 310

PREVENTING FAST READ BEFORE WRITE IN STATIC RANDOM ACCESS MEMORY ARRAYS

BACKGROUND

The present application relates generally to an improved data processing apparatus and method and more specifically to mechanisms for preventing fast read before write in static random access memory arrays.

Random access memory (RAM) most commonly refers to computer chips that temporarily store dynamic data to enhance computer performance. By storing frequently used or active files in random access memory, a computer may access the data faster than if the computer retrieves the data from a far-larger hard drive. Random access memory is volatile memory, meaning it loses its contents once power is cut. This is different from non-volatile memory such as hard disks and flash memory, which do not require a power source to retain data. When a computer shuts down properly, data located in random access memory is committed to permanent storage on the hard drive or flash drive. At the next boot-up, RAM begins to fill with programs automatically loaded at startup and with files opened by the user.

Random access memory, which may also be referred to as cache memory arrays, is comprised of a plurality of memory cells having an individual logic circuit associated with each memory cell. Cache memory arrays may also employ the concept of a valid bit. Each logical row of memory cells contains at least one bit used to indicate whether the data stored is valid or invalid. Traditionally, the lookup would occur regardless of the state of the valid bit. Additional logic after the memory array output would discard the data returned from a read operation if the value stored for the valid bit denoted invalid data. The memory cell used to store data in an invalid bit may be different from traditional cells, such as the 6T cell. This difference consists of a reset port that may switch the state of the cell without the need for a standard wordline driver enabled access.

SUMMARY

In one illustrative embodiment, a method, in a data processing system, is provided for enabling a proper write through during a write-through operation. The illustrative embodiment determines whether a memory access for a memory cell in a plurality of memory cells in the cache access memory is either a read operation or a write-through operation. The illustrative embodiment determines whether a data input signal is in a first state or a second state in response to determining the memory access as the write-through operation. The illustrative embodiment outputs a global write line signal in the first state in response to the data input signal being in the second state. The illustrative embodiment outputs a column select signal in the second state in response to the global write line signal being in the first state. The illustrative embodiment keeps a downstream read path of the cache access memory at the first state such that the data output by the cache access memory is in the first state in response to the column select signal being in the second state.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for guaranteeing that a proper write through will occur, even though there may be a fast read, regardless of the amount of skew between the row access and the write lines (more skew is likely with smaller and smaller devices in current technology causing more variability). The mechanism to block the fast read and allow the correct write through data to propagate is completely independent of row access. The mechanism is also self-contained within the global circuitry that generates the write lines and receives the global read data with no other external dependency.

Figure 1:
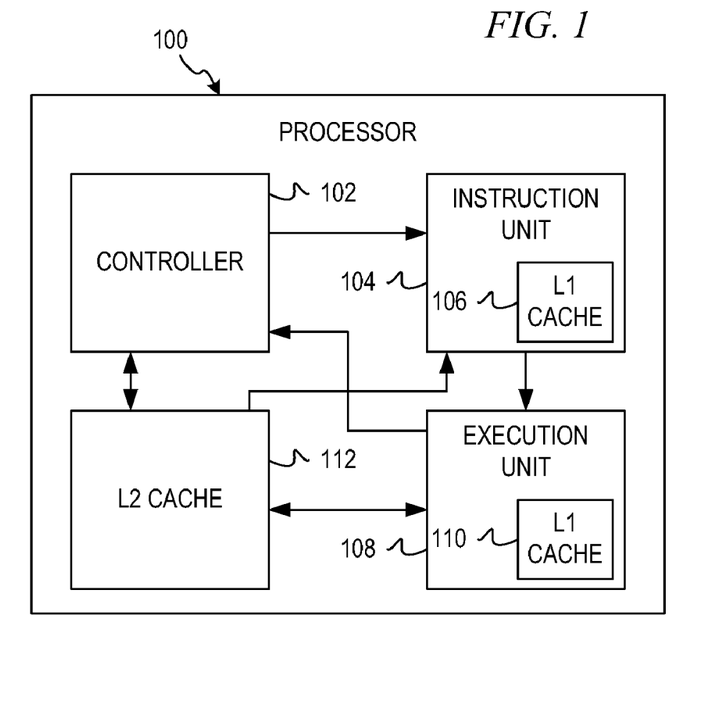
FIG. 1 is an exemplary block diagram of a processor in accordance with an illustrative embodiment.

FIG. 1 provides one example of a data processing environment in which a cache memory array may be utilized, i.e. in a cache of a processor. FIG. 1 is only offered as an example data processing environment in which the aspects of the illustrative embodiments may be implemented and is not intended to state or imply any limitation with regard to the types of, or configurations of, data processing environments in which the illustrative embodiments may be used. To the contrary, any environment in which a cache memory array may be utilized is intended to be within the spirit and scope of the present invention.

FIG. 1 is an exemplary block diagram of processor 100 in accordance with an illustrative embodiment. Processor 100 includes controller 102, which controls the flow of instructions and data into and out of processor 100. Controller 102 sends control signals to instruction unit 104, which includes L1 cache 106. Instruction unit 104 issues instructions to execution unit 108, which also includes L1 cache 110. Execution unit 108 executes the instructions and holds or forwards any resulting data results to, for example, L2 cache 112 or controller 102. In turn, execution unit 108 retrieves data from L2 cache 112 as appropriate. Instruction unit 104 also retrieves instructions from L2 cache 112 when necessary. Controller 102 sends control signals to control storage or retrieval of data from L2 cache 112. Processor 100 may contain additional components not shown, and is merely provided as a basic representation of a processor and does not limit the scope of the present invention.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. In addition, the processes of the illustrative embodiments may be applied to a multiprocessor data processing system, without departing from the spirit and scope of the present invention.

Moreover, the data processing system 100, which may also be referred to as an information handling system, may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device that is configured with flash memory to provide non-volatile memory for storing operating system files and/or user-generated data, for example. Essentially, data processing system 100 may be any known or later developed data processing system without architectural limitation.

Figure 2:
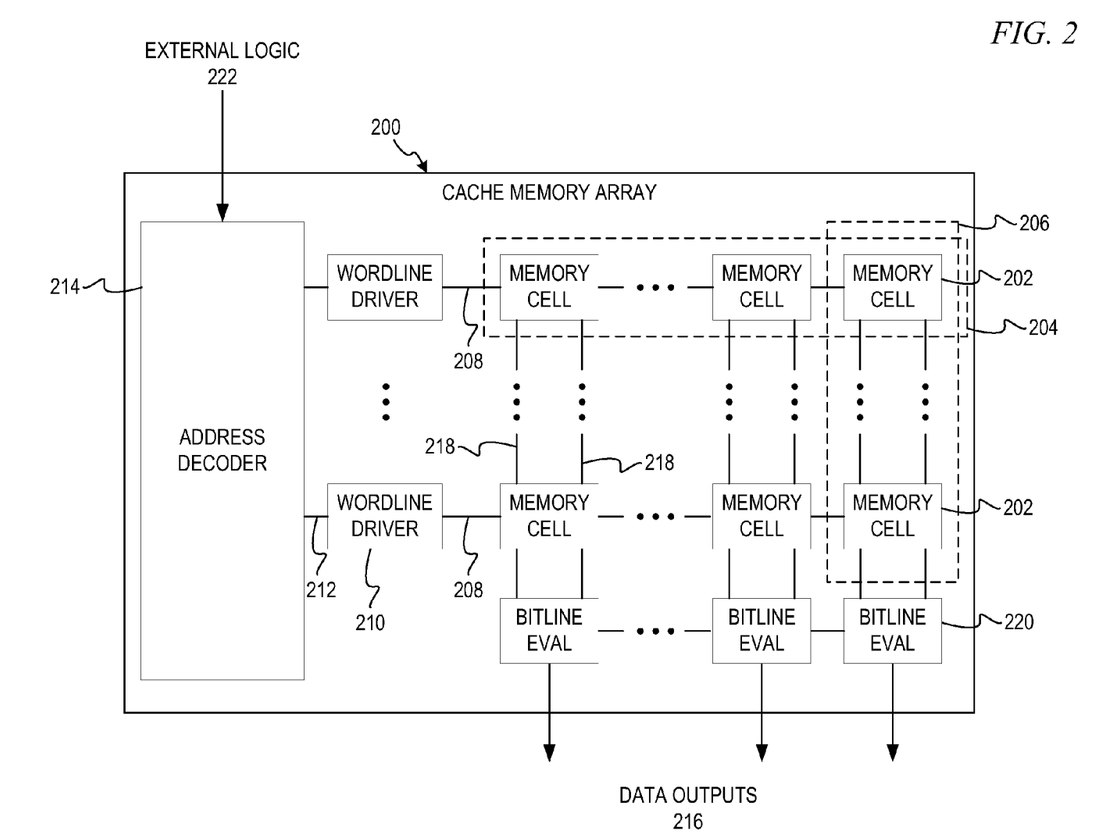
FIG. 2 illustrates a high-level example of a cache memory array comprising multiple memory cells in accordance with an illustrative embodiment.

FIG. 2 illustrates a high-level example of a cache memory array 200 comprising multiple memory cells 202 in accordance with an illustrative embodiment. Memory cells 202 are arranged as an array having rows 204 and columns 206. Memory cells 202 in a particular row 204 connect to one another by wordlines 208. Wordlines 208 of each row 204 also connect to wordline drivers 210 that receive output 212 from address decoder 214. Address decoder 214 identifies which row 204 is to be output and cache memory array 200 outputs the corresponding data entry through data outputs 216. Memory cells 202 in a particular column 206 connect to one another by a pair of bitlines 218. Wordline drivers 210 drive bitlines 218 to complementary during read/write executions and are traditionally precharged to the voltage supply. In the illustrative embodiments, wordline driver 210 driving bitlines 218 to complementary means that when one bitline of bitlines 218, commonly referred to as the true bitline, is high, 1, or the like, the other bitline, commonly referred to as the complement, is low, 0, or the like. The true and complement bitlines 218 feed bitline evaluators 220, which may be sense amplifiers, to convert the differential signal to a single-ended signal for use in logic downstream.

In operation, address decoder 214 receives an address associated with a read/write access from external logic 222. Address decoder 214 decodes the address and signals a particular one of wordline drivers 210 associated with the decoded address using output 212. The particular one of wordline drivers 210 then fires due to the signal from address decoder 214. Data in row 204 of memory cells 202 associated with the firing wordline driver 210 outputs through data outputs 216 if the access is a read access or, if the access is a write access, writes data to memory cells 202 in associated row 204.

Figure 3:
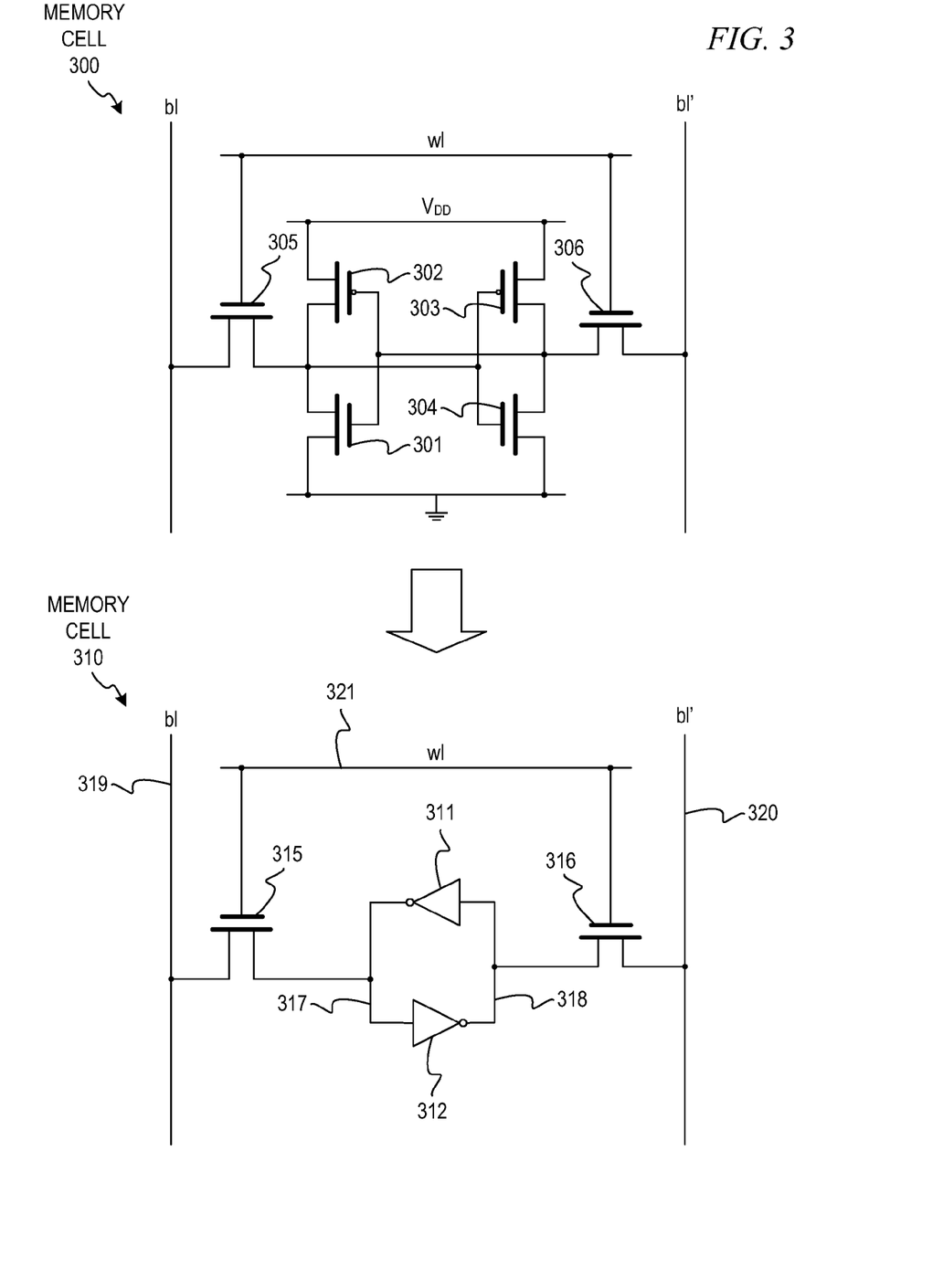
FIG. 3 depicts an example of a memory cell in accordance with an illustrative embodiment.

FIG. 3 depicts an example of a memory cell, such as one of memory cells 202 of FIG. 2, in accordance with an illustrative embodiment. Memory cell 300 forms the basis for most static random-access memories (SRAM) in complementary metal-oxide-semiconductor (CMOS) technology. Memory cell 300 uses six transistors 301-306 to store and access one bit. Transistors 301-304 form two cross-coupled inverters, which is illustrated in memory cell 310 comprising inverters 311 and 312. Due to the feedback structure created by inverters 311 and 312, a low input value on inverter 311 will generate a high value on inverter 312, which amplifies (and stores) the low value on inverter 312. Similarly, a high input value on inverter 311 will generate a low input value on inverter 312, which feeds back the low input value onto inverter 311. Therefore, inverters 311 and 312 will store their current logical value, whatever value that is.

Lines 317 and 318 between inverters 311 and 312 connect to separate bitlines 319 and 320 via two n-channel pass-transistors 315 and 316. Wordline 321 drives the gates of transistors 315 and 316. In a memory array, such as memory array 200 of FIG. 2, wordline 321 addresses and enables all bits of one memory word. As long as wordline 321 stays low, memory cell 310 disconnects from bitlines 319 and 320 and memory cell 310 stores its current value.

When wordline 321 is high, both transistors 315 and 316 conduct and connect the inputs and outputs of inverters 311 and 312 to bitlines 319 and 320. That is, inverters 311 and 312 drive the current data value stored inside the memory cell 310 onto bitline 319 and the inverted data value on inverted bitline 320. A bitline evaluator then amplifies this data, such as bitline evaluators 220 of FIG. 2, and generates the output value of memory cell 310 during a read operation. To write new data into memory cell 310, wordline 321 activates and, depending on the current value stored inside memory cell 310, the value inside memory cell 310 may be overwritten. This only works because transistors 301-304 that make up inverters 311 and 312 are very weak. That is, transistors 301-304 are considered weak because when new data writes to transistors 301-304, the current state of transistors 301-304 may be easily overridden with the new state.

In a SRAM read operation, transistors 315 and 316 will open and the data will flow from inverters 311 and 312 onto bitlines 319 and 320 discharging one side. During a write, a wordline driver will drive data onto bitlines 319 and 320, through transistors 315 and 316, and into inverters 311 and 312. Some cases will require a write-thru operation where a wordline driver will write data into inverters 311 and 312 and immediately issue a read of the written data at an output. During this type of operation, transistors 315 and 316 may open before the write data arrives and the data stored in inverters 311 and 312 will be read onto bitlines 319 and 320 discharging them. This fast read before write problem may cause the wrong value to be output.

This illustrative embodiment provides a mechanism to prevent fast read before write by creating a signal that acts to either allow or block the read data from propagating to the output based on the write data. With the described self-contained mechanism, any changes to the read or write circuitry due to process, voltage, or temperature variations will also affect the fast read before write prevention circuit. Within the mechanism, there is minimal overhead as the gates used in the mechanism are basic logic gates. The mechanism maintains the testability of the read and write paths because the signal generated does not interfere with the actual read/write being performed. The additional logic is integrated into the already required column selection circuitry. The total access time is not affected because the column selection path will arrive earlier than the read access path.

The following figures depict components that activate or deactivate based on signals that may be referred to as active, a HIGH state, a 1, or the like, or that may be referred to as inactive, a LOW state, a 0, or the like. For simplicity, the following descriptions use the terms 1 or 0, although it is understood that there are many terms that may be used to describe an active state or an inactive state. While the illustrative embodiments use 1 to reflect that the state of the signal is HIGH and use 0 to reflect that the state of the signal is LOW, one of ordinary skill in the art would recognize that components in the following circuitry may be substituted with complementary components, thereby a previously HIGH signal may become a LOW signal and a previously LOW signal may become a HIGH signal. Thus, the illustrative embodiments recognize that the following circuitry may be replaced with complementary components providing the same results without departing from the spirit and scope of the invention. The illustrative embodiments also recognize that an asserted signal may result in either a 0 or 1 and a deasserted signal may result in a 1 or 0 depending on the component implementation without departing from the spirit and scope of the invention.

Figure 4:
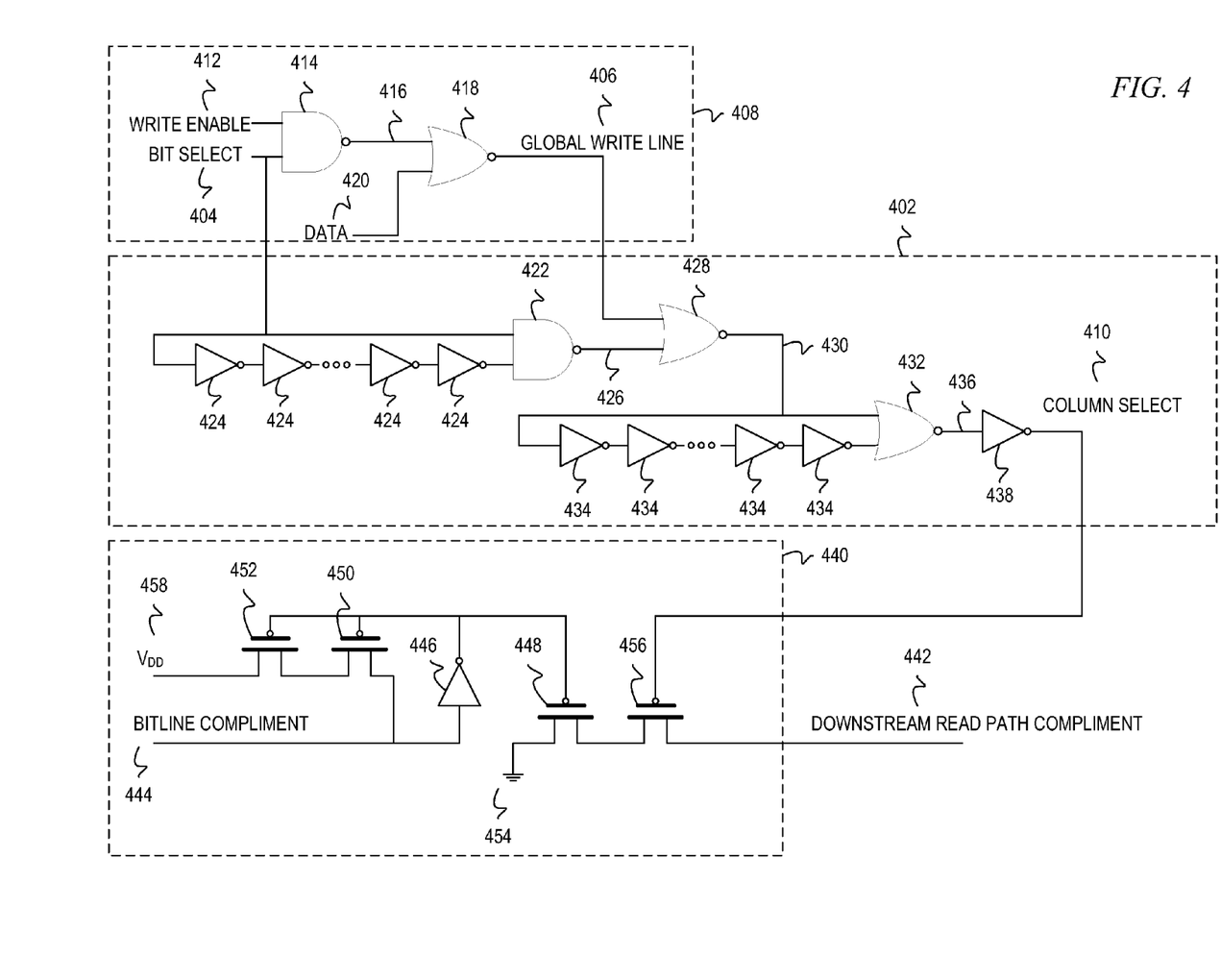
FIG. 4 depicts a fast read before write protection circuit in conjunction with global write line and global read line select circuits for a particularly selected memory cell in accordance with an illustrative embodiment.

FIG. 4 depicts a fast read before write protection circuit in conjunction with global write line and global read line select circuits for a particularly selected memory cell in accordance with an illustrative embodiment. Within a cache memory array, such as cache memory array 200 of FIG. 2, fast read before write protection circuit 402 may be implemented just prior to bitline evaluation such as bitline evaluation 220 in FIG. 2. Fast read before write protection circuit 402 uses bit select signal 404 and global write line signal 406 from global write line select circuit 408 to enable or disable column select signal 410. Global write line select circuit 408 receives as input write enable signal 412 and bit select signal 404, which are ANDed using NAND gate 414. NAND gate 414 operates as follows: if write enable signal 412 and bit select signal 404 are both 1, then output signal 416 of NAND gate 414 is 0, otherwise output signal 416 of NAND gate 414 is 1. Output signal 416 of NAND gate 414 is input signal 416 to NOR gate 418 along with data input signal 420. NOR gate 418 operates as follows: if input signal 416 and data input signal 420 are both 0, then global write line signal 406, which is the output of NOR gate 418, is 1, otherwise global write line signal 406 of NOR gate 418 is 0.

Examples of the operation of global write line select circuit 408 are as follows: if the operation performed on the cache memory array is a read operation, then global write line signal 406 will be 0 because write enable signal 412 is 0. If however, the operation performed on the cache memory array is a write or write through operation, then global write line signal 406 depends on the value of data input signal 420. If the value of data input signal 420 is 0, then global write line signal 406 will be 1. If the value of data input signal 420 is 1, then global write line signal 406 will be 0.

Again, fast read before write protection circuit 402 uses bit select signal 404 and global write line signal 406 from global write line select circuit 408 to enable or disable column select signal 410. In fast read before write protection circuit 402, NAND gate 422 receives bit select signal 404 directly as well as the time delayed bit select signal 404 through inverters 424, which are used to manipulate the pulse of bit select signal 404 in order to ensure proper timing overlap. Thus, the number of inverters 424 may differ in order to provide proper timing; however, the number of inverters 424 must always be an even number. NAND gate 422 operates the same as NAND gate 414 such that: if bit select signal 404 and delayed bit select signal 404 are both 1, then output 426 of NAND gate 422 is 0, otherwise output 426 of NAND gate 422 is 1. NOR gate 428 receives output signal 426 along with global write line signal 406. NOR gate 428 operates as follows: if output signal 426 and global write line signal 406 are both 0, then output signal 430, which is the output of NOR gate 428, is 1, otherwise output signal 430 of NOR gate 428 is 0.

NOR gate 432 receives output signal 430 directly as well as the time delayed output signal 430 through inverters 434, which are used to stretch the pulse of output signal 430 in order to ensure proper timing overlap. Thus, the number of inverters 434 may differ in order to provide proper timing; however, the number of inverters 434 must always be an even number. NOR gate 432 operates as follows: if output signal 430 and delayed output signal 430 are both 0, then output signal 436, which is the output of NOR gate 432, is 1, otherwise output signal 436 of NOR gate 432 is 0. Inverter 438 then inverts output signal 436 and outputs column select signal 410 to global read line select circuit 440.

Thus, if data being written will require downstream read path complement 442 to be pulled down from its precharged HIGH value, then column select signal 410 from fast read before write protection circuit 402 will be activated, allowing for the write data to propagate to the read path and be discharged. Note that in this case, if the fast read value is the same as the write value, then the fast read is already the desired value and, if the fast read value is the opposite value, then the read is only holding the precharged value and the write data will eventually propagate and discharge the downstream read path. Either way, the read path will be discharged as desired. However, if data being written will require the read path to remain precharged, then column select signal 410 will remain off, thus ensuring that the precharged value will be read-blocking any fast read that could inadvertently discharge the read path. The read path that fast read before write protection circuit 402 is controlling, whether to be discharged or not, is illustrated in global read line select circuit 440.

Global read line select circuit 440 receives as input bitline complement signal 444 and column select signal 410. When bitline complement signal 444 is 0, then inverter 446 inverts the signal such that the n-type field effect transistor (NFET) 448 is active and p-type field effect transistors (PFETs) 450 and 452 are inactive. By activating NFET 448 then downstream read path complement 442 has a path to be discharged to ground 454 depending on the state of NFET 456 that is controlled by column select signal 410. That is, as discussed above, if data 420 being written will require downstream read path complement 442 to be pulled down from its precharged HIGH value and data 420 being written to then memory cell is a 1, then column select signal 410 from fast read before write protection circuit 402 will be activated. By activating fast read before write protection circuit 402, the write data may then propagate to the read path and be discharged. Thus, the output of downstream read path complement 442 is a 0, which is the value that should be read on a complement signal when the data in is a 1.

When bitline complement signal 444 is 1, then inverter 446 inverts the signal such that the NFET 448 is inactive and PFETs 450 and 452 are active. By deactivating NFET 448 then downstream read path complement 442 does not have a path to be discharged to ground 454 regardless of the state of NFET 456 that is controlled by column select signal 410. That is, if data being written will require the read path to remain precharged, then column select signal 410 will remain off. By column select signal 410 remaining off the precharged value will be read-blocking any fast read that could inadvertently discharge the read path. PFETs 450 and 452 form a keeper device, such that when PFETs 450 and 452 are activated, Vdd 458 is allowed to pass through to inverter 446, keeping NFET 448 inactive.

Thus, fast read before write protection circuit 402 guarantees that a proper write through will occur, even though there may be a fast read. The mechanism to block the fast read and allow the correct write through data to propagate is completely independent of row access and self-contained within the global circuitry that generates the write lines and receives the global read data with no other external dependency.

Figure 5A:
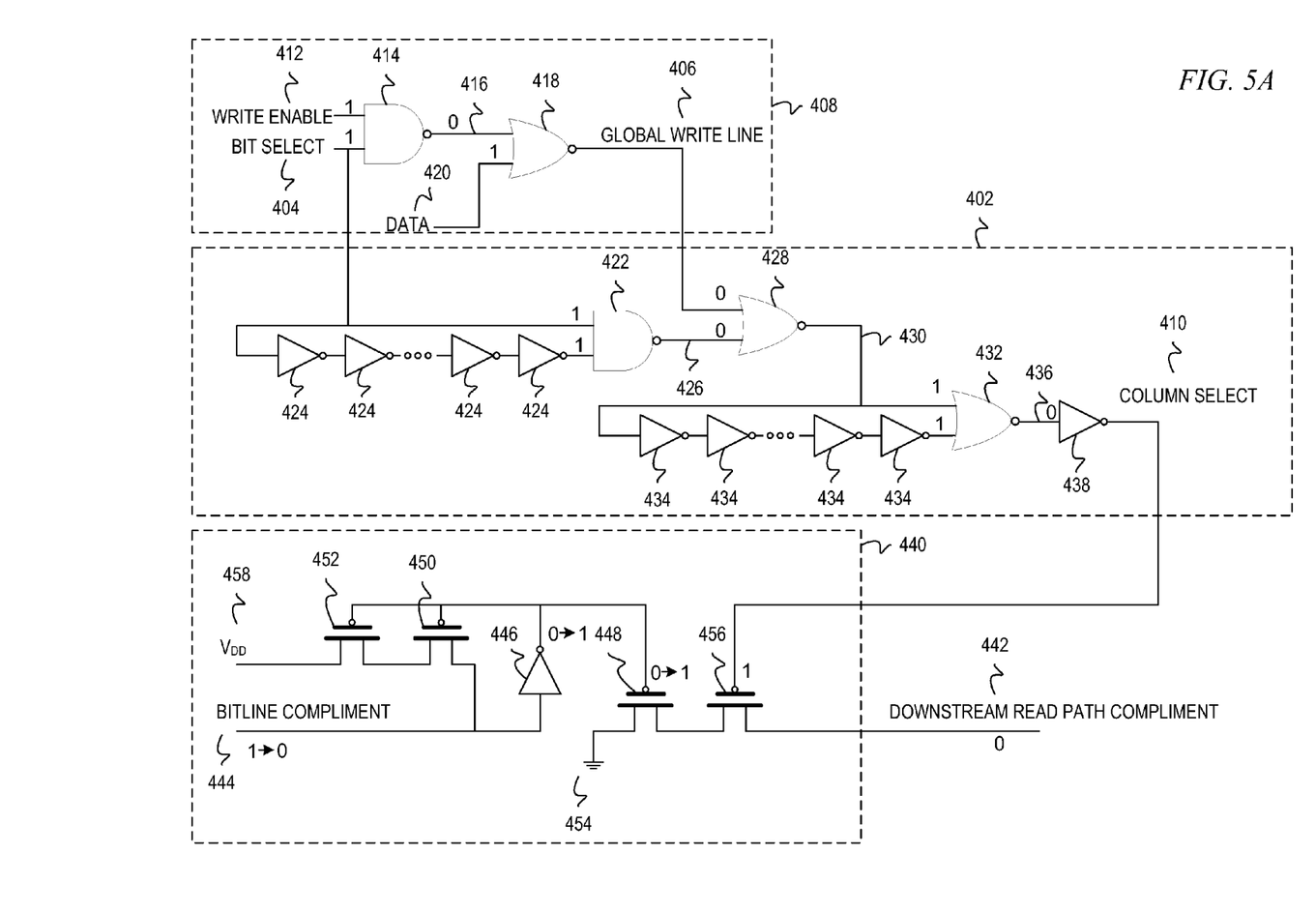
FIGS. 5A-5C provide examples of how the fast read before write protection circuit guarantees that a proper write through will occur even though there may be a fast read in accordance with an illustrative embodiment.
Figure 5B:
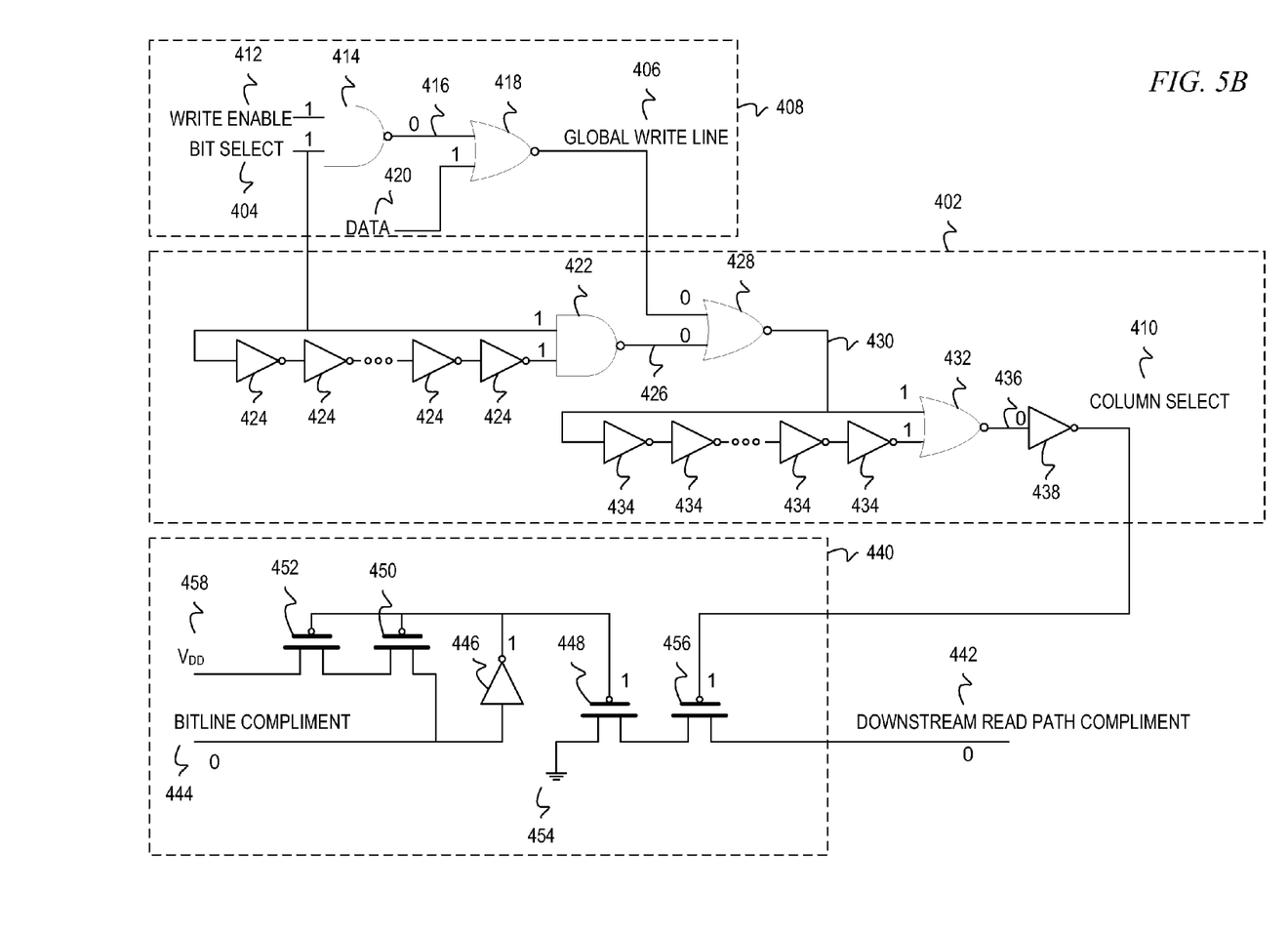
Figure 5C:
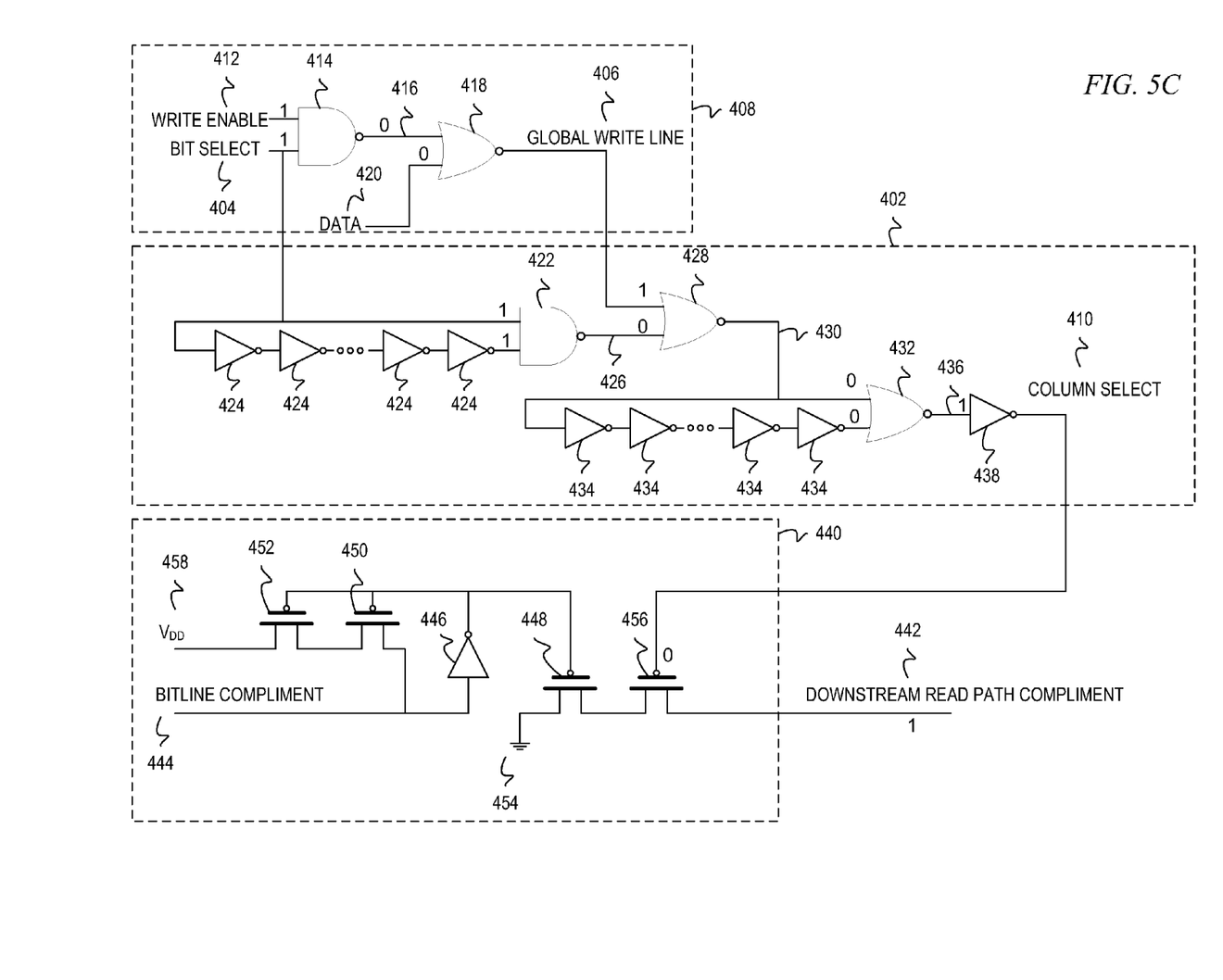

FIGS. 5A-5C provide examples of how the fast read before write protection circuit guarantees that a proper write through will occur even though there may be a fast read in accordance with an illustrative embodiment. For illustration, FIG. 5A-5C depicts the three possible write through conditions that may occur when writing and immediately reading to a memory cell and the states associated with each element. FIG. 5A depicts a condition where the memory cell has a 0 stored and a 1 is being written to the memory cell. When a write operation begins, bit select signal 404 and write enable single 412 are 1s, which causes output signal 416 of NAND gate 414 to be a 0. Because data signal 420 being written is a 1, NOR gate 418 outputs a 0 as global write line signal 406. With bit select signal 404 being a 1, NAND gate 422 outputs a 0 as output signal 426 that, when combined with the 0 of global write line signal 406, causes NOR gate 428 to output a 1 as output signal 430. With output signal 430 being a 1, NOR gate 432 causes output signal 436 to be 0 that is inverted by inverter 438 and column select 410 is a 1, which causes NFET 456 to turn on. With the fast read, then memory cell will output a 0 on the bitline and a 1 on bitline complement 444. The 1 on bitline complement 444 will cause inverter 446 to output a 0, but with the 1 being written to the cell, the output of the memory cell will change to 0 causing the bitline to become a 1 and bitline complement 444 to become a 0. This causes inverter 446 to output a 1, which causes NFET 448 to turn on and downstream read path complement 442 to discharge, thereby causing a 0 to be read out. Since a 1 is being written, then one would expect downstream read path complement 442 to be a 0, which is the actual output. Although there is a small delay in the change of the output, the illustrative embodiments provide for a delay in the actual read of downstream read path complement 442, so that the actual value may be read.

FIG. 5B depicts a condition where the memory cell has a 1 stored and a 1 is being written to the memory cell. When a write operation begins, bit select signal 404 and write enable single 412 are 1s, which causes output signal 416 of NAND gate 414 to be a 0. Because data signal 420 being written is a 1, NOR gate 418 outputs a 0 as global write line signal 406. With bit select signal 404 being a 1, NAND gate 422 outputs a 0 as output signal 426 that, when combined with the 0 of global write line signal 406, causes NOR gate 428 to output a 1 as output signal 430. With output signal 430 being a 1, NOR gate 432 causes output signal 436 to be 0 that is inverted by inverter 438 and column select 410 is a 1, which causes NFET 456 to turn on. With the fast read, then memory cell will output a 1 on the bitline and a 0 on bitline complement 444. The 0 on bitline complement 444 will cause inverter 446 to output a 1, which causing NFET 448 to turn on and downstream read path complement 442 to discharge, thereby cause a 0 to be read out. Since a 1 is being written, then one would expect downstream read path complement 442 to be a 0, which is the actual output. In this instance, the output of the memory cell will not change.

FIG. 5C depicts a condition where the memory cell has either a 0 or a 1 stored and a 0 is being written to the memory cell. When a write operation begins, bit select signal 404 and write enable single 412 are 1s, which causes output signal 416 of NAND gate 414 to be a 0. Because data signal 420 being written is a 0, NOR gate 418 outputs a 1 as global write line signal 406. With bit select signal 404 being a 1, NAND gate 422 outputs a 0 as output signal 426 that, when combined with the 1 of global write line signal 406, causes NOR gate 428 to output a 0 as output signal 430. With output signal 430 being a 0, NOR gate 432 causes output signal 436 to be 1 that is inverted by inverter 438 and column select 410 is a 0, which causes NFET 456 to turn off. With NFET 456 being off downstream read path complement 442 will always remain charged, thereby causing a 1 to be read out regardless of what the previous value in the memory cell is.

Thus, if data being written will require the downstream read path complement signal to be pulled down from its precharged HIGH value, then the column select signal from the fast read before write protection circuit will be activated, allowing for the write data to propagate to the read path and be discharged. However, if data being written will require the read path to remain precharged, then the column select signal will remain off, thus, ensuring that the precharged value will be read-blocking any fast read that could inadvertently discharge the read path.

The fast read before write protection circuitry of the illustrative embodiments, such as those described above with regard to FIGS. 4 and 5A-5C, is preferably implemented in an integrated circuit device. The fast read before write protection circuitry, for example, may be used in a processor for performing multiplication operations. It should be appreciated, however, that the circuitry described above may further be implemented as one or more software routines, in some illustrative embodiments, that approximate the operation of the circuits described above. Thus, not only may the illustrative embodiments be embodied in circuitry of a hardware device, such as an integrated circuit, processor, or the like, but they may also be implemented as software instructions executed by a processor.

Figure 6:
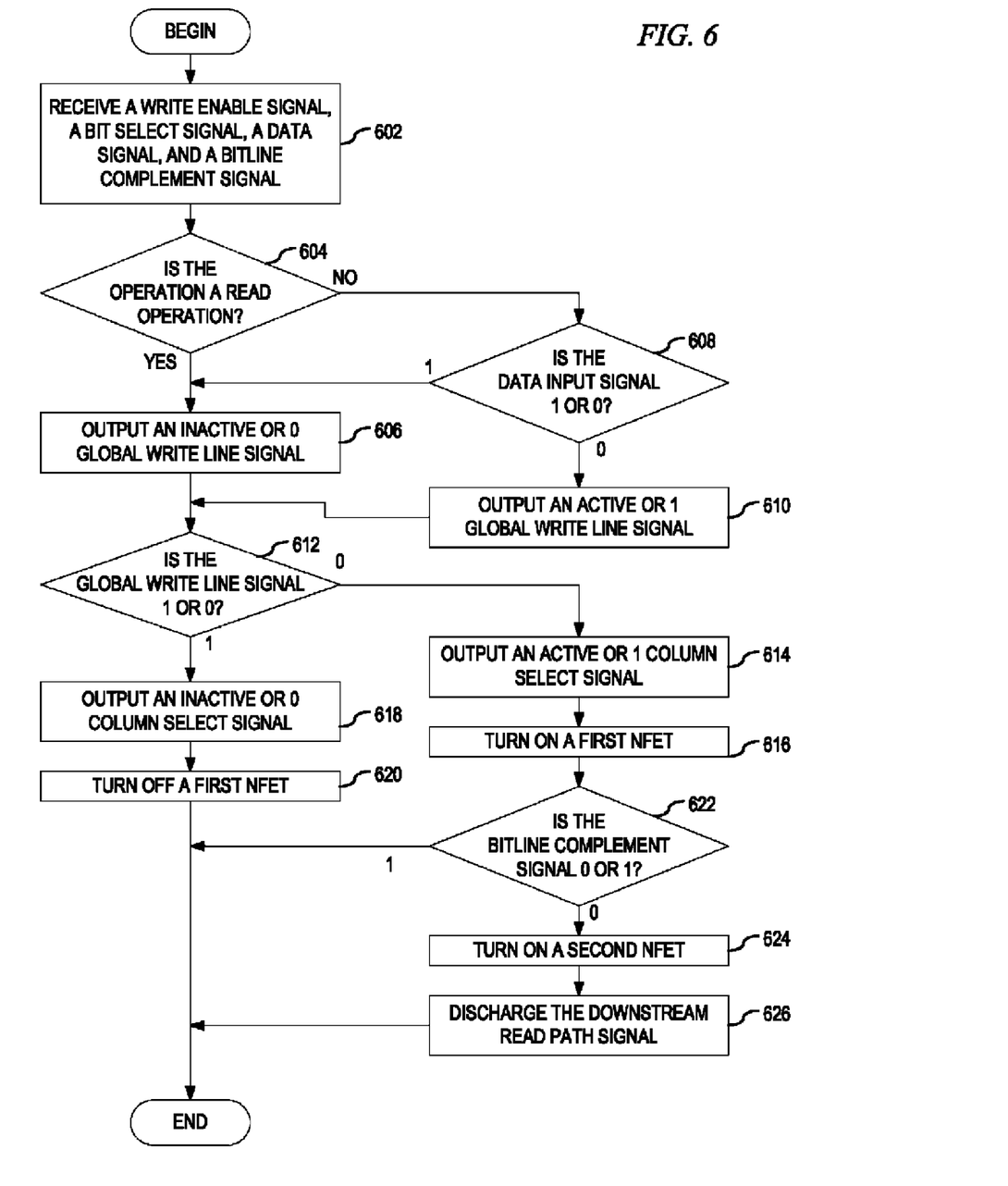
FIG. 6 is a flowchart outlining an exemplary operation of a cache memory array using a fast read before write protection circuit in accordance with one illustrative embodiment.

FIG. 6 is a flowchart outlining an exemplary operation of a cache memory array using a fast read before write protection circuit in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 6, the operation starts by a global write line circuitry in a cache memory array receiving a write enable signal, a bit select signal, a data signal associated with a write through operation from external logic, and a bitline complement signal (step 602). The global write line circuitry determines whether the operation is a read operation, that is, whether the write enable signal is 0 (step 604). If at step 604 the operation is a read operation, then the global write line circuitry outputs a 0 global write line signal (step 606). If at step 604 the operation is not a read operation, then the global write line circuitry determines whether data input signal is 1 or 0 (step 608) If at step 608 the global write line circuitry determines if data input signal is 1, then the global write line circuitry outputs an 0 global write line signal (step 606). If at step 608 the global write line circuitry determines if data input signal is 0, then the global write line circuitry outputs a 1 global write line signal (step 610).

From step 606 or 610, fast read before write protection circuitry determines whether to activate or deactivate a column select signal. The fast read before write protection circuitry determines whether the global write line signal is 1 or 0 (step 612). If at step 612 the global write line signal is 0, then fast read before write protection circuitry outputs a 1 column select signal (step 614) and turns on a first NFET that controls one portion of a discharge of a downstream read path signal (step 616). If at step 612 the global write line signal is 1, then fast read before write protection circuitry outputs a 0 column select signal (step 618) and turns off the first NFET that controls one portion of a discharge of a downstream read path signal (step 620) thereby keeping the downstream read path signal from discharging and the operation terminates.

From step 616, global read line select circuitry determines whether to discharge the downstream read path signal. The global read line select circuit determines whether the bitline complement signal from the memory cell is 0 or 1 (step 622). The operation performed in step 622 is dynamic such that, if the bitline complement signal changes over time, then the output of the global read line select circuitry will change. Thus, if at step 622 global read line select circuitry determines that the bitline complement signal is a 0 or a 1 change to a 0, then the global read line select circuitry turns on a second NFET (step 624) and discharges the downstream read path signal (step 626), thereby outputting a 0 as the downstream read path signal and the operation terminates. If at step 622 global read line select circuitry determines that the bitline complement signal is a 1 or a 0 change to a 1, then the global read line select circuitry is irrelevant because that data being read on the bitline complement signal is a 0 that has already turned off the first NFET keeping the downstream read path signal from discharging and the operation terminates.

Thus, the illustrative embodiments provide a mechanism to prevent fast read before write by creating a signal, which acts to either allow or block the read data from being propagated to the output based on the write data. With the described self-contained mechanism, any changes to the read or write circuitry due to process, voltage, or temperature variations will also affect the fast read before write prevention circuit. Thus, the devices will track requiring no additional tuning. Within the mechanism, there is minimal overhead as the gates used in the mechanism are basic logic gates. The mechanism maintains the testability of the read and write paths because the signal generated does not interfere with the actual read/write being performed. The additional logic is integrated into the already required column selection circuitry. The total access time is not affected at all because the column selection path will arrive earlier than the read access path.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 7:
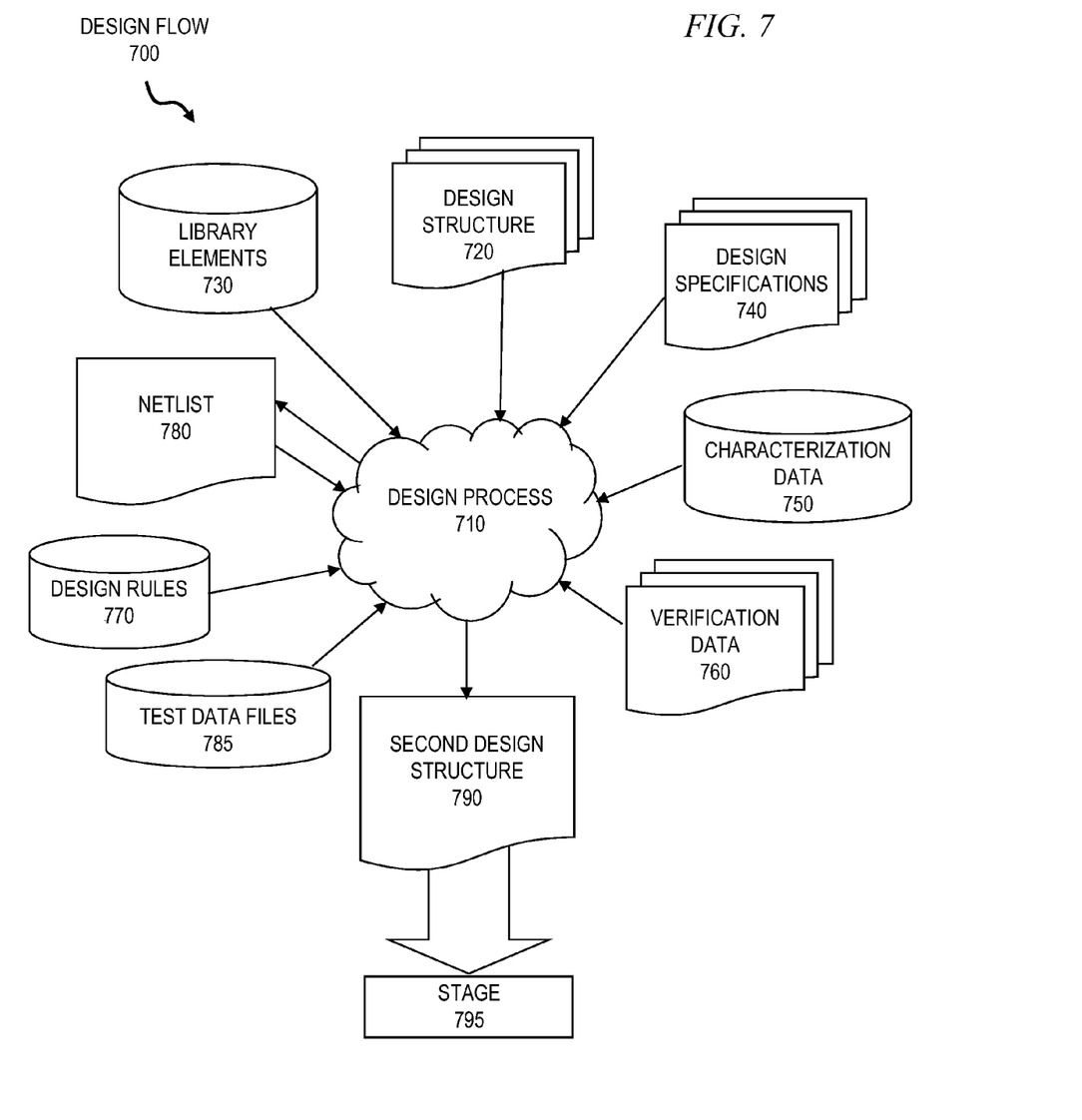
FIG. 7 is a flow diagram of a design process used in semiconductor design, manufacture, and/or test.

FIG. 7 shows a block diagram of an exemplary design flow 700 used, for example, in semiconductor IC logic design, simulation, test, layout, and manufacture. Design flow 700 includes processes and mechanisms for processing design structures to generate logically or otherwise functionally equivalent representations of the embodiments of the invention shown in FIGS. 2-6. The design structures processed and/or generated by design flow 700 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 2-6. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 2-6 to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include modules for performing standard circuit design processes such as timing analysis, verification, design rule checking, place and route operations, etc.

Design process 710 employs and incorporates well-known logic and physical design tools such as HDL compilers and simulation model build tools to process design structure 720 together with some or all of the depicted supporting data structures to generate a second design structure 790. Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-6. In one embodiment, design structure 790 may comprise a compiled, executable HDL simulation model that functionally simulates the devices shown in FIGS. 2-6.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 2-6. Design structure 790 may then proceed to a stage 795 where, for example, design structure 790 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a cache access memory, for enabling a proper write through during a write-through operation, the method comprising:
   determining, by first circuitry in the cache access memory, whether a memory access for a memory cell in a plurality of memory cells in the cache access memory is either a read operation or the write-through operation;
   responsive to determining that the memory access is the write-through operation, determining, by the first circuitry, whether a data input signal is in a first state or a second state;
   responsive to the data input signal being in the second state, outputting, by the first circuitry, a global write line signal in the first state;
   responsive to the global write line signal being in the first state, outputting, by second circuitry, a column select signal in the second state; and
   responsive to the column select signal being in the second state, keeping, by third circuitry, a downstream read path of the cache access memory at the first state such that data output by the cache access memory is in the first state.

2. The method of claim 1, further comprising:
   responsive to the data input signal being in the first state, outputting, by the first circuitry, the global write line signal in the second state;
   responsive to the global write line signal being in the second state, outputting, by the second circuitry, a column select signal in the first state; and
   responsive to the column select signal being in the first state and responsive to a bitline complement signal being in a second state, allowing, by the third circuitry, the downstream read path to discharge such that the data output by the cache access memory is in the second state.

3. The method of claim 2, further comprising:
responsive to the bitline complement signal being in the first state, keeping, by the third circuitry, the downstream read path at the first state such that the data output by the cache access memory is in the first state.

4. The method of claim 1, wherein the first circuitry is global write line circuitry, wherein the second circuitry is fast read before write protection circuitry, and wherein the global write line circuitry comprises:
a NAND gate, wherein the NAND gate has inputs of a write enable signal and bit select signal; and
a NOR gate, wherein the NOR gate receives an output from the NAND gate and the data input signal;
responsive to receiving the memory access that is the read operation:
responsive to the bit select signal being in the first state and the write enable signal being in the second state, the NAND gate outputs a first signal in the first state to the NOR gate; and
responsive to receiving the first signal in the first state, the NOR gate outputs a second signal in the second state to the fast read before write protection circuitry regardless of the data input signal being in the first state or in the second state; and
responsive to receiving the write-through operation:
responsive to the bit select signal being in the first state and the write enable signal being in the first state, the NAND gate outputs the first signal in the second state to the NOR gate;
responsive to receiving the first signal in the second state and responsive to the data input signal being in the second state, the NOR gate outputs the second signal in the first state to the fast read before write protection circuitry; and
responsive to receiving the first signal in the second state and responsive to the data input signal being in the first state, the NOR gate outputs the second signal in the second state to the fast read before write protection circuitry.

5. The method of claim 1, wherein the first circuitry is global write line circuitry, wherein the second circuitry is fast read before write protection circuitry, wherein the third circuitry is global read line circuitry, and wherein the fast read before write protection circuitry comprises:
a NAND gate, wherein the NAND gate has inputs of a bit select signal and a delayed bit select signal, wherein the delayed bit select signal is delayed by a first set of one or more pairs of inverters connected in series between the bit select signal and the NAND gate;
a first NOR gate, wherein the first NOR gate receives an output from the NAND gate and an output of the global write line circuitry;
a second NOR gate, wherein the second NOR gate receives an output from the first NOR gate and a delayed output from the first NOR gate, wherein the delayed output from the first NOR gate is delayed by a second set of one or more pairs of inverters connected in series between the output from the first NOR gate and the second NOR gate;
responsive to the bit select signal being in the first state, the NAND gate outputs a first signal in the second state to the first NOR gate;
responsive to the output of the global write line circuitry being in the first state, the first NOR gate outputs a second signal in the second state to the second NOR gate; and
responsive to receiving the second signal in the second state from the first NOR gate, the second NOR gate outputs a third signal in the first state to an inverter, wherein the inverter inverts the third signal in the first state to a fourth signal in the second state and outputs the fourth signal in the second state to the global read line circuitry.

6. The method of claim 5, further comprising:
responsive to the output of the global write line circuitry being in the second state, the first NOR gate outputs the second signal in the first to the second NOR gate; and
responsive to receiving the second signal in the first state from the first NOR gate, the second NOR gate outputs the third signal in the second state to the inverter, wherein the inverter inverts the third signal in the second state to the fourth signal in the first state and outputs the fourth signal in the first state to the global read line circuitry.

7. The method of claim 1, wherein the third circuitry is global read line circuitry, and wherein the global read line circuitry comprises:
a first NFET, wherein a gate of the first NFET is coupled to the output of the fast read before write protection circuitry, wherein a source of the first NFET is coupled to the downstream read path signal, and wherein a drain of the first NFET is coupled to a source of a second NFET;
the second NFET, wherein the source of the second NFET is coupled to the drain of the first NFET, wherein a drain of the second NFET is coupled to ground, and wherein a gate of the second NFET is coupled to an output of an inverter, a gate of a first PFET, and a gate of a second PFET;
the inverter, wherein an input of the inverter is coupled to a bitline complement signal and wherein the output of the inverter is coupled to the gate of the second NFET, the gate of the first PFET, and the gate of the second PFET;
the first PFET, wherein the gate of the first PFET is coupled to the gate of the second PFET, the gate of the second NFET, and the output of the inverter, wherein the drain of the first PFET is coupled to the bitline complement signal and the input of the inverter, and wherein the source of the first PFET is coupled to the drain of the second PFET;
the second PFET, wherein the gate of the second PFET is coupled to the gate of the first PFET, the gate of the second NFET, and the output of the inverter, wherein the drain of the second PFET is coupled to source of the first PFET, and wherein the source of the second PFET is coupled to a voltage source;
responsive to the bitline complement signal being in the second state, the inverter outputs a first signal in the first state to the second NFET thereby causing the second NFET to turn on; and
responsive to the bitline complement signal being in the first state signal, the inverter outputs a first signal in the second state to the second NFET thereby causing the second NFET to turn off.

8. A processor comprising:
a controller; and
a cache access memory coupled to the controller, wherein the cache access memory comprises:
first circuitry for determining whether a memory access for a memory cell in a plurality of memory cells in the cache access memory is either a read operation or a write-through operation, for determining whether a data input signal is in a first state or a second state in response to determining the memory access as the write-through operation, and for outputting a global write line signal in the first state in response to the data input signal being in the second state;

second circuitry for outputting a column select signal in the second state in response to the global write line signal being in the first state; and third circuitry for keeping a downstream read path of the cache access memory at the first state such that data output by the cache access memory is in the first state in response to the column select signal being in the second state.

9. The processor of claim 8, wherein the cache access memory further comprises:

the first circuitry outputting the global write line signal in the second state in response to the data input signal being in the first state;

the second circuitry outputting a column select signal in the first state in response to the global write line signal being in the second state; and the third circuitry allowing the downstream read path to discharge such that the data output by the cache access memory is in the second state in response to the column select signal being in the first state and responsive to a bitline complement signal being in a second state.

10. The processor of claim 9, wherein the cache access memory further comprises:

the third circuitry keeping the downstream read path at the first state such that the data output by the cache access memory is in the first state in response to the bitline complement signal being in the first state.

11. The processor of claim 8, wherein the first circuitry is global write line circuitry, wherein the second circuitry is fast read before write protection circuitry, and wherein the global write line circuitry comprises:

a NAND gate, wherein the NAND gate has inputs of a write enable signal and bit select signal; and a NOR gate, wherein the NOR gate receives an output from the NAND gate and the data input signal;

responsive to receiving the memory access that is the read operation:

responsive to the bit select signal being in the first state and the write enable signal being in the second state, the NAND gate outputs a first signal in the first state to the NOR gate; and responsive to receiving the first signal in the first state, the NOR gate outputs a second signal in the second state to the fast read before write protection circuitry regardless of the data input signal being in the first state or in the second state; and responsive to receiving the write-through operation:

responsive to the bit select signal being in the first state and the write enable signal being in the first state, the NAND gate outputs the first signal in the second state to the NOR gate;

responsive to receiving the first signal in the second state and responsive to the data input signal being in the second state, the NOR gate outputs the second signal in the first state to the fast read before write protection circuitry; and responsive to receiving the first signal in the second state and responsive to the data input signal being in the first state, the NOR gate outputs the second signal in the second state to the fast read before write protection circuitry.

12. The processor of claim 8, wherein the first circuitry is global write line circuitry, wherein the second circuitry is fast read before write protection circuitry, wherein the third circuitry is global read line circuitry, and wherein the fast read before write protection circuitry comprises:

a NAND gate, wherein the NAND gate has inputs of a bit select signal and a delayed bit select signal, wherein the delayed bit select signal is delayed by a first set of one or more pairs of inverters connected in series between the bit select signal and the NAND gate;

a first NOR gate, wherein the first NOR gate receives an output from the NAND gate and an output of the global write line circuitry;

a second NOR gate, wherein the second NOR gate receives an output from the first NOR gate and a delayed output from the first NOR gate, wherein the delayed output from the first NOR gate is delayed by a second set of one or more pairs of inverters connected in series between the output from the first NOR gate and the second NOR gate;

responsive to the bit select signal being in the first state, the NAND gate outputs a first signal in the second state to the first NOR gate;

responsive to the output of the global write line circuitry being in the first state, the first NOR gate outputs a second signal in the second state to the second NOR gate; and responsive to receiving the second signal in the second state from the first NOR gate, the second NOR gate outputs a third signal in the first state to an inverter, wherein the inverter inverts the third signal in the first state to a fourth signal in the second state and outputs the fourth signal in the second state to the global read line circuitry.

13. The processor of claim 12, further comprising:

responsive to the output of the global write line circuitry being in the second state, the first NOR gate outputs the second signal in the first to the second NOR gate; and responsive to receiving the second signal in the first state from the first NOR gate, the second NOR gate outputs the third signal in the second state to the inverter, wherein the inverter inverts the third signal in the second state to the fourth signal in the first state and outputs the fourth signal in the first state to the global read line circuitry.

14. The processor of claim 8, wherein the third circuitry is global read line circuitry and wherein the global read line circuitry comprises:

a first NFET, wherein a gate of the first NFET is coupled to the output of the fast read before write protection circuitry, wherein a source of the first NFET is coupled to the downstream read path signal, and wherein a drain of the first NFET is coupled to a source of a second NFET;

the second NFET, wherein the source of the second NFET is coupled to the drain of the first NFET, wherein a drain of the second NFET is coupled to ground, and wherein a gate of the second NFET is coupled to an output of an inverter, a gate of a first PFET, and a gate of a second PFET;

the inverter, wherein an input of the inverter is coupled to a bitline complement signal and wherein the output of the inverter is coupled to the gate of the second NFET, the gate of the first PFET, and the gate of the second PFET;

the first PFET, wherein the gate of the first PFET is coupled to the gate of the second PFET, the gate of the second NFET, and the output of the inverter, wherein the drain of the first PFET is coupled to the bitline complement signal and the input of the inverter, and wherein the source of the first PFET is coupled to the drain of the second PFET;

the second PFET, wherein the gate of the second PFET is coupled to the gate of the first PFET, the gate of the second NFET, and the output of the inverter, wherein the drain of the second PFET is coupled to source of the first PFET, and wherein the source of the second PFET is coupled to a voltage source;

responsive to the bitline complement signal being in the second state, the inverter outputs a first signal in the first state to the second NFET thereby causing the second NFET to turn on; and responsive to the bitline complement signal being in the first state signal, the inverter outputs a first signal in the second state to the second NFET thereby causing the second NFET to turn off.

15. An information handling system comprising:
a processor; and
memory coupled to the processor, wherein the memory comprises instructions which, when executed by the processor, cause the processor to:
determine, using first circuitry in the cache access memory, whether a memory access for a memory cell in a plurality of memory cells in the cache access memory is either a read operation or a write-through operation;
responsive to determining the memory access as the write-through operation, determine, using the first circuitry, whether a data input signal is in a first state or a second state;
responsive to the data input signal being in the second state, output, using the first circuitry, a global write line signal in the first state;
responsive to the global write line signal being in the first state, output, using second circuitry, a column select signal in the second state; and
responsive to the column select signal being in the second state, keep, using third circuitry, a downstream read path of the cache access memory at the first state such that data output by the cache access memory is in the first state.

16. The information handling system of claim 15, further comprising:
responsive to the data input signal being in the first state, output, using the first circuitry, the global write line signal in the second state;
responsive to the global write line signal being in the second state, output, using the second circuitry, a column select signal in the first state; and
responsive to the column select signal being in the first state and responsive to a bitline complement signal being in a second state, allow, using the third circuitry, the downstream read path to discharge such that the data output by the cache access memory is in the second state.

17. The information handling system of claim 16, further comprising:
responsive to the bitline complement signal being in the first state, keep, using the third circuitry, the downstream read path at the first state such that the data output by the cache access memory is in the first state.

18. The information handling system of claim 15, wherein the first circuitry is global write line circuitry, wherein the second circuitry is fast read before write protection circuitry, and wherein the global write line circuitry comprises:
a NAND gate, wherein the NAND gate has inputs of a write enable signal and bit select signal; and
a NOR gate, wherein the NOR gate receives an output from the NAND gate and the data input signal;
responsive to receiving the memory access that is the read operation:
responsive to the bit select signal being in the first state and the write enable signal being in the second state, the NAND gate outputs a first signal in the first state to the NOR gate; and
responsive to receiving the first signal in the first state, the NOR gate outputs a second signal in the second state to the fast read before write protection circuitry regardless of the data input signal being in the first state or in the second state; and
responsive to receiving the write-through operation:
responsive to the bit select signal being in the first state and the write enable signal being in the first state, the NAND gate outputs the first signal in the second state to the NOR gate;
responsive to receiving the first signal in the second state and responsive to the data input signal being in the second state, the NOR gate outputs the second signal in the first state to the fast read before write protection circuitry; and
responsive to receiving the first signal in the second state and responsive to the data input signal being in the first state, the NOR gate outputs the second signal in the second state to the fast read before write protection circuitry.

19. The information handling system of claim 15, wherein the first circuitry is global write line circuitry, wherein the second circuitry is fast read before write protection circuitry, wherein the third circuitry is global read line circuitry, and wherein the fast read before write protection circuitry comprises:
a NAND gate, wherein the NAND gate has inputs of a bit select signal and a delayed bit select signal, wherein the delayed bit select signal is delayed by a first set of one or more pairs of inverters connected in series between the bit select signal and the NAND gate;
a first NOR gate, wherein the first NOR gate receives an output from the NAND gate and an output of the global write line circuitry;
a second NOR gate, wherein the second NOR gate receives an output from the first NOR gate and a delayed output from the first NOR gate, wherein the delayed output from the first NOR gate is delayed by a second set of one or more pairs of inverters connected in series between the output from the first NOR gate and the second NOR gate;
responsive to the bit select signal being in the first state, the NAND gate outputs a first signal in the second state to the first NOR gate;
responsive to the output of the global write line circuitry being in the first state, the first NOR gate outputs a second signal in the second state to the second NOR gate; and
responsive to receiving the second signal in the second state from the first NOR gate, the second NOR gate outputs a third signal in the first state to an inverter, wherein the inverter inverts the third signal in the first state to a fourth signal in the second state and outputs the fourth signal in the second state to the global read line circuitry.

20. The information handling system of claim 19, further comprising:
responsive to the output of the global write line circuitry being in the second state, the first NOR gate outputs the second signal in the first to the second NOR gate; and
responsive to receiving the second signal in the first state from the first NOR gate, the second NOR gate outputs the third signal in the second state to the inverter, wherein the inverter inverts the third signal in the second state to the fourth signal in the first state and outputs the fourth signal in the first state to the global read line circuitry.

21. The information handling system of claim 15, wherein the third circuitry is global read line circuitry and wherein the global read line circuitry comprises:
   a first NFET, wherein a gate of the first NFET is coupled to the output of the fast read before write protection circuitry, wherein a source of the first NFET is coupled to the downstream read path signal, and wherein a drain of the first NFET is coupled to a source of a second NFET;
   the second NFET, wherein the source of the second NFET is coupled to the drain of the first NFET, wherein a drain of the second NFET is coupled to ground, and wherein a gate of the second NFET is coupled to an output of an inverter, a gate of a first PFET, and a gate of a second PFET;
   the inverter, wherein an input of the inverter is coupled to a bitline complement signal and wherein the output of the inverter is coupled to the gate of the second NFET, the gate of the first PFET, and the gate of the second PFET;
   the first PFET, wherein the gate of the first PFET is coupled to the gate of the second PFET, the gate of the second NFET, and the output of the inverter, wherein the drain of the first PFET is coupled to the bitline complement signal and the input of the inverter, and wherein the source of the first PFET is coupled to the drain of the second PFET;
   the second PFET, wherein the gate of the second PFET is coupled to the gate of the first PFET, the gate of the second NFET, and the output of the inverter, wherein the drain of the second PFET is coupled to source of the first PFET, and wherein the source of the second PFET is coupled to a voltage source;
   responsive to the bitline complement signal being in the second state, the inverter outputs a first signal in the first state to the second NFET thereby causing the second NFET to turn on; and
   responsive to the bitline complement signal being in the first state signal, the inverter outputs a first signal in the second state to the second NFET thereby causing the second NFET to turn off.

* * * * *